FREQUENCY CONVERTER

Filed July 20, 1959 2 Sheets-Sheet 1

INVENTOR.
KERN K.N. CHANG
BY
Eugene M. Whitacre
ATTORNEY

INVENTOR.
KERN K.N. CHANG
BY
Eugene M. Whitacre
ATTORNEY 3,125,725
Patented Mar. 17, 1964

3,125,725

FREQUENCY CONVERTER

Kern K. N. Chang, Princeton, N.J., assignor to Radio Corporation of America, a corporation of Delaware Filed July 20, 1959, Ser. No. 828,342
32 Claims. (Cl. 325—449)

This invention relates to wave-signal frequency-changing systems, and more particularly to frequency converter systems of the type employing nonlinear diodes.

Signal receiving systems of the superheterodyne type require some means for converting a received signal modulated carrier wave into a corresponding intermediate frequency wave. Frequency converter circuits for accomplishing this function have been proposed which include a diode having a nonlinear voltage-current characteristic. In such circuits, the received signal modulated carrier wave and an oscillation signal, from a separate local oscillation generator, are applied to the diode to derive an intermediate frequency signal which is generated due to the interaction of the received carrier wave and oscillator signals in the nonlinear resistance of the diode. Such circuits do not ordinarily provide a conversion gain of unity or greater because the resistance of the diode dissipates a portion of the signal power applied thereto. This dissipation undesirably results in a reduction of the signal-to-noise ratio of a receiver in which a diode frequency converter is used, unless the signal is suitably amplified before being applied thereto.

It is accordingly an object of this invention to provide an improved wave-signal frequency-changing system.

It is a further object of this invention to provide an improved diode frequency converter system which can provide a conversion gain of greater than unity.

A still further object of this invention is to provide an improved diode frequency converter of simple construction which does not require a separate local oscillation generator stage.

A frequency converter circuit embodying the invention includes a negative resistance diode, such as a tunnel diode, which is biased to exhibit a nonlinear negative resistance to signals applied thereto. Received modulated carrier waves, and locally generated oscillation signals are applied to the diode, and the nonlinear interaction of currents produced by these signals results in the production of several sideband frequencies. Signal energy at a desired one of these sideband frequencies is selected by coupling a suitable tuned circuit to the negative resistance device. The negative resistance exhibited by the diode causes power to be supplied to the various circuits connected therewith, and therefore, a conversion power gain of greater than unity may be achieved.

In accordance with a feature of the invention, the negative resistance diode may serve as the active element of the local oscillation generator. Thus, a single diode may provide the active element of a self-oscillating frequency converter circuit which is capable of providing a conversion gain of greater than unity.

The novel features that are considered to be characteristic of this invention are set forth with particularity in the appended claims. The invention itself, however, both as to its organization and method of operation as well as additional objects and advantages thereof will best be understood from the following description when read in connection with the accompanying drawing, in which:

Figures 1, 2, 3, 4, 5:
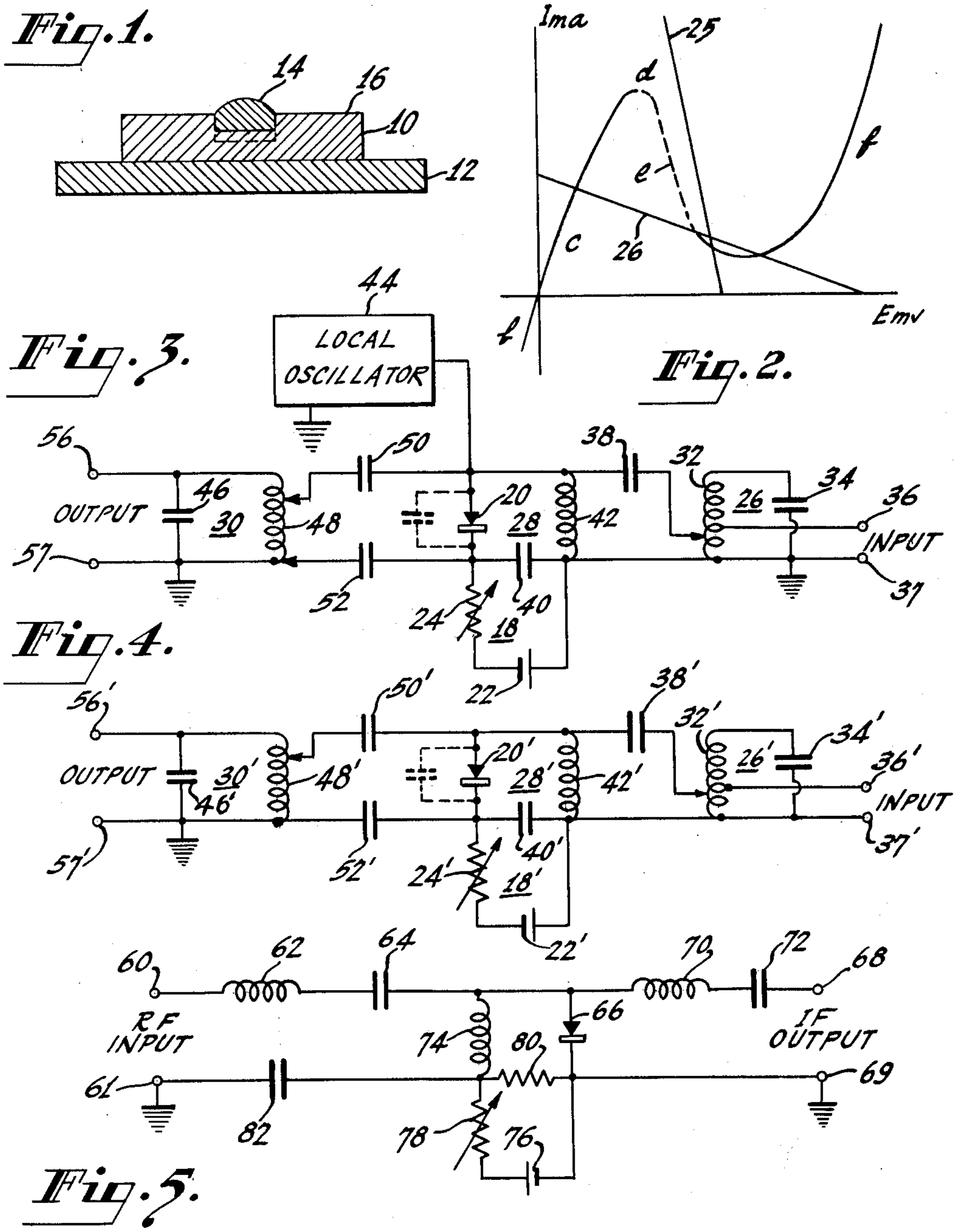
FIGURE 1 is a sectional view of a diode which may be used in frequency converters embodying the invention.
FIGURE 2 is a graph illustrating the current-voltage characteristic of a negative resistance diode of a type shown in FIGURE 1.
FIGURE 3 is a schematic circuit diagram of a frequency converter embodying the invention.
FIGURE 4 is a schematic circuit diagram of a self-oscillating frequency converter embodying the invention.
FIGURE 5 is a schematic circuit diagram illustrating another self-oscillating frequency converter circuit embodying the invention.

Reference is now made to FIGURE 1 which is a diagrammatic sectional view of a typical negative resistance diode that may be used in the arrangement of the invention. By way of example, Leo Esaki, Physical Review, vol. 109, page 603, 1958, has reported a thin or abrupt junction diode exhibiting a negative resistance over a region of low forward bias voltages, i.e., less than 0.3 volt. The diode was prepared with a semiconductor having a free charge carrier concentration several orders of magnitude higher than that used in other diodes.

A diode which was constructed and could be used in practicing the invention includes a single crystal bar of n-type germanium which is doped with arsenic to have a donor concentration of $4.0 \times 10^{19}$ $cm.^{-3}$ by methods known in the semiconductor art. This may be accomplished, for example, by pulling a crystal from molten germanium containing the requisite concentration of arsenic. A wafer 10 is cut from the bar along the 111 plane, i.e. a plane perpendicular to the 111 crystallographic axis of the crystal. The wafer 10 is etched to a thickness of about 2 mils with a conventional etch solution. A major surface of this wafer 10 is soldered to a strip 12 of a conductor such as nickel, with a conventional lead-tin-arsenic solder, to provide a non-rectifying contact between the wafer 10 and the strip 12. The nickel strip 12 serves eventually as a base lead. A 5 mil diameter dot 14 of 99 percent by weight indium, 0.5 percent by weight zinc and 0.5 weight percent gallium is placed with a small amount of a commercial flux on the free surface 16 of the germanium wafer 10 and then heated to a temperature in the neighborhood of 450° C. for one minute in an atmosphere of dry hydrogen to alloy a portion of the dot to the free surface 16 of the wafer 10, and then cooled rapidly. In the alloying step, the unit is heated and cooled as rapidly as possible so as to produce an abrupt p-n junction. The unit is then given a final dip etch for 5 seconds in a slow iodide etch solution, followed by rinsing in distilled water. A suitable slow iodide etch is prepared by mixing one drop of a solution comprising 0.55 gram potassium iodide, and 100 $cm.^3$ concentrated acetic acid, and 100 $cm.^3$ concentrated hydrofluoric acid. A pigtail connection may be soldered to the dot where the device is to be used at ordinary frequencies. Where the device is to be used at high frequencies, contact may be made to the dot with a low impedance lead.

A semiconductor device, prepared according to the above example, exhibits the following characteristics:

$\overline{R}$=1 ohm (Ω)

C=500 micromicrofarads (μμf.)

$\overline{R}$C=0.5 millimicrosecond (mμs).

where $\overline{R}$ is the average value of the negative resistance from current maximum to current minimum; C is the capacitance of the junction at the operating point of the diode; and $\overline{R}$C is the approximate time constant determining the frequency characteristic of the diode.

Other semiconductors may be used instead of germanium, particularly silicon and the III–V compounds. A III compound is a compound composed of an element from group III and group V of the periodic table of chemical elements, such as gallium arsenide, indium arsenide and indium antimonide. Where III–V compounds are used, the p and n-type impurities ordinarily used in those compounds are also used to form the diode described. Thus, sulfur is a suitable n-type impurity and zinc a suitable p-type impurity, both of which are also suitable for alloying.

The current-voltage characteristic of a diode suitable for use with circuits embodying the invention is shown in FIGURE 2. The current scales depend on area and doping of the junction, but representative currents are in the milliampere range.

For a small voltage in the back direction, the back current of the diode increases as a function of voltage as is indicated by the region *b* of FIGURE 2.

For small forward bias voltages, the characteristic is symmetrical (FIGURE 2, region *c*). According to present theory, the forward current results from quantum mechanical tunneling. At higher forward bias voltages, the forward current (believed due to quantum mechanical tunneling) reaches a maximum (region *d*, FIGURE 2), and then begins to decrease. This drop continues (FIGURE 2, region *e*) until eventually normal injection over the barrier becomes important and the characteristic turns into the usual forward behavior (region *f*, FIGURE 2). A diode dependent on this "tunneling" effect and having a characteristic such as that illustrated in FIGURE 2 is called a "tunnel" diode.

The negative resistance of the diode is the incremental change in voltage divided by the incremental change in current, or the reciprocal slope, of the region *e* of FIGURE 2. The diode may be biased for stable operation in the negative resistance region by the use of a voltage source having a smaller internal impedance than the negative resistance of the diode. As shown in FIGURE 3 the voltage source 18 may comprise a battery 22 and a variable resistor 24, with the internal resistance of the source being the sum of the internal resistance of the battery 22 and the adjusted resistance of the variable resistor 24. Such a voltage source has a D.C. load line 25 as indicated in FIGURE 2, which is characterized by a current-voltage relationship which has a greater slope than the negative slope of the diode characteristic and intersects the diode characteristic at only a single point. If the voltage source 18 has an internal resistance which is greater than the negative resistance of the diode, the source would have a load line 26 with a smaller slope than the negative slope of the diode characteristic as indicated in FIGURE 2, and would intersect the diode characteristic curve at three points. Under the latter conditions the diode is not stably biased in the negative resistance region. This lack of stability arises because an incremental change in current through the diode due to transient or noise currents or the like produces a regenerative reaction which causes the diode to assume one of its two stable states represented by the intersection of the load line 26 with the positive resistance portions of the diode characteristic curve.

In the converter circuit of FIGURE 3, a negative-resistance diode 20 which may be of the type described, is connected in parallel with three tuned circuits 26, 28 and 30. The circuit 26 which is coupled to the diode 20 through a pair of direct current blocking capacitors 38 and 40, includes an inductor 32 and a capacitor 34 which are tuned to the frequency of an incoming signal modulated radio frequency (RF) carrier wave applied between a pair of input terminals 36 and 37. The impedance of the capacitors 38 and 40 are made sufficiently high that severe loading of the tuned circuits 28 and 30 is prevented. The input terminal 36 is connected to a tap on the inductor 32 to match the RF carrier wave source impedance to the resistance of the diode.

The tuned circuit 28 includes an inductor 42 which resonates with the capacitance of the diode 20 at the frequency of a local oscillator signal applied to the diode from an external oscillation generator 44. The interaction of the oscillator signal and the signal modulated RF carrier wave in the nonlinear negative resistance of the diode 20 results in a production of several sideband signals having frequencies of the original signals, the sum and difference of the original signals, and other frequencies produced by harmonics of the original signals and interactions therebetween.

The circuit 30 which includes a capacitor 46 and an inductor 48, resonates at the frequency of the desired sideband or intermediate frequency (IF) signal, and is coupled to the diode 20 through a pair of D.C. blocking capacitors 50 and 52. To match the small negative resistance of the diode 20 to the impedances of the circuits 26 and 30, the diode is tapped down on these circuits. In the circuit shown, the frequency of the desired IF signal is equal to the difference between the frequencies of the signal modulated carrier wave and the oscillator signals, and appears across a pair of output terminals 56 and 57. For stability, the effective positive conductance of each of the circuits 26, 28 and 30 exceeds in absolute value the negative conductance of the diode 20.

The D.C. voltage source 18 is connected to the anode of the diode 20 through the inductor 42, and directly to the cathode of the diode in a sense to forward bias the diode 20. The capacitor 40 is connected across the voltage source 18 to complete the oscillator circuit and to damp parasitic osillation which may tend to occur in the D.C. biasing circuit. The total resistance of the resistor 24, the battery 22 and the inductor 42 is less than the negative resistance of the diode 20, so that the diode may be stably biased in its negative resistance region. To obtain the maximum amount of nonlinearity for the generation of heterodyne signals, the resistance of the resistor 24 may be adjusted to bias the diode to a point on the negative slope near the current minimum, or alternatively, near the current maximum. If desired, the diode may be biased in a positive resistance region of its characteristic such that the applied signals drive it into the negative resistance region over at least a portion of its operating cycle.

Since the diode 20 exhibits a negative resistance, it tends to supply power to each of the three circuits 26, 28 and 30. This permits the frequency converter circuit of the invention to provide a greater conversion power gain than is obtainable with other known frequency converters of this general type. It appears that the enhanced conversion gain of circuits embodying the invention may be explained by the following simplified consideration. The RF and oscillator signals from the circuits 26 and 28 respectively, interact in the nonlinear resistance of the diode 20 to produce an intermediate frequency signal. Thus, the circuits 26 and 28 may be considered to be the equivalent of an intermediate frequency signal source which is connected across the terminals of the diode 20 and also across the terminals of the tuned circuit 30. An IF voltage developed by this source tends to drive a current in one direction through circuit 30. It may be assumed that the source is matched to the circuit 30 at the IF so that maximum direct power transfer is effected.

The IF voltage is also impressed across the negative resistance diode 20, and produces a change in current therethrough, the instantaneous direction of which is opposite to the direction of the change in current through the circuit 30. The diode current path includes the circuit 30 and the diode current is in the direction to aid the current directly produced in the circuit 30 by the impressed IF voltage. Thus, a larger IF current flows through the circuit 30 than can be produced by the effective IF source alone, so that a conversion power gain can be achieved. A converter of the type described which exhibited excellent operating characteristics was designed for operation from a 70 mc. RF signal source, and used a 40 mc. oscillation generator to derive a 30 mc. IF signal.

FIGURE 4 is a schematic circuit diagram of a self-oscillating negative resistance diode converter circuit. In this circuit no external oscillation generator is required. Three parallel resonant circuits 26', 28' and 30' which are tuned to frequencies corresponding respectively to the RF, oscillator and IF signals, are connected in parallel with a negative resistance diode 20'. Signal modulated RF carrier waves from a source not shown, are applied to a pair of input terminals 36' and 37' which are tapped down on the circuit 26'. Signals developed across the circuit 26' are coupled to the negative resistance diode 20' by way of the D.C. blocking capacitors 38' and 40'. The oscillator circuit 28' includes an inductor 42' which resonates with the inherent capacitance of the diode 20' at the desired frequency of oscillation, and the IF circuit 30' is coupled to the diode by way of the blocking capacitors 50' and 52'.

The diode is stably biased by a suitable voltage source 18' which includes a variable resistor 24' and a battery 22' to exhibit a nonlinear negative resistance to the applied signal voltages. The circuit values are selected so that the negative conductance of the diode 20' is less than the positive conductance of either the RF input circuit 26' or the IF output circuit 30' so that the converter is stable at the RF input and at the IF frequencies. However, the positive conductance of the resonant elements of the oscillator circuit 28' is less than the negative conductance exhibited by the diode 20' so that the circuit oscillates at the tuned frequency of the oscillator circuit 28'.

The applied signal modulated RF carrier wave and the generated local oscillation signal which are applied to the diode 20' interact in the nonlinear resistance of the diode to produce an IF signal which may be developed across the IF circuit 30' and appears at the output terminals 56' and 57'. As set forth above, the negative resistance of the diode supplies power to the IF circuit, thereby enabling the circuit to exhibit an excellent conversion power gain factor.

FIGURE 5 is a schematic circuit diagram of a self-oscillating frequency converter circuit which provides increased isolation between the input and output terminals. A signal modulated RF carrier wave from a source, not shown, is applied between a pair of input terminals 60 and 61, with the terminal 61 being connected with a point of reference potential or ground. A series circuit including an inductor 62 and a capacitor 64 which are resonant at the input signal frequency (RF) is connected between the input terminal 60 ond one terminal of a negative resistance diode 66. The frequency converter also includes a pair of IF output terminals 68 and 69, with the terminal 69 being grounded. An inductor 70 and a capacitor 72 which are resonant at the IF are connected between the terminal 68 and the negative resistance diode 66. The inherent capacity of the diode 66 is tuned by an inductor 74 connected in parallel with the diode to form a parallel circuit resonant at the desired local oscillator frequency.

The diode is biased to exhibit a stable nonlinear negative resistance characteristic by a suitable voltage source which includes a battery 76, a variable resistor 78 in series with the battery, and a voltage divider resistor 80 connected between the inductor 74 and the cathode of the diode 66. The positive resistance of the resistor 80 is less than the negative resistance of the diode 66; hence the D.C. biasing circuit sees a net positive resistance so that parasitic oscillations will not occur. The resistor 80 is bypassed for signal frequencies by a capacitor 82 and is therefore at equipotential alternating current (A.C.) points. Thus, the resistor has little or no effect on A.C. circuit operation, and the diode 66 appears as a negative resistance to the A.C. circuits.

The total effective positive resistance of the RF circuit 62—64, and the IF circuit 70—72 (each of which are in series with the diode 66) is greater than the negative resistance of the diode so that the converter is stable at these frequencies. However, the effective resistance of the oscillator tuned circuit 74, 66 which is in parallel with the diode 66 is greater than the negative resistance of the diode so the circuit will oscillate at the oscillator frequency. This arrangement provides the desired local signal for heterodyning with the applied RF carrier in the nonlinear resistance of the diode 66 to produce the resultant IF signal. The RF input circuit 62—64 is series resonant at the frequency of the signal modulated carrier wave and therefore presents minimum impedance at these frequencies. However this circuit presents a relatively high impedance at the oscillator and intermediate frequency. In like manner the series resonant IF output circuit 70—72 presents minimum impedance at the IF, but presents a relatively higher impedance at the oscillator and RF signal frequencies. This circuit configuration tends to prevent IF and oscillator signals from reaching the input terminals 60 and 61, and also tends to prevent the RF and oscillator signals from reaching the output terminals 68 and 69.

As pointed out hereinabove, the negative resistance of the diode 66 enhances the conversion gain characteristic of the frequency converter, over other known types of converters since the diode appears to supply power to each of the three tuned circuits connected therewith.

Figure 6:
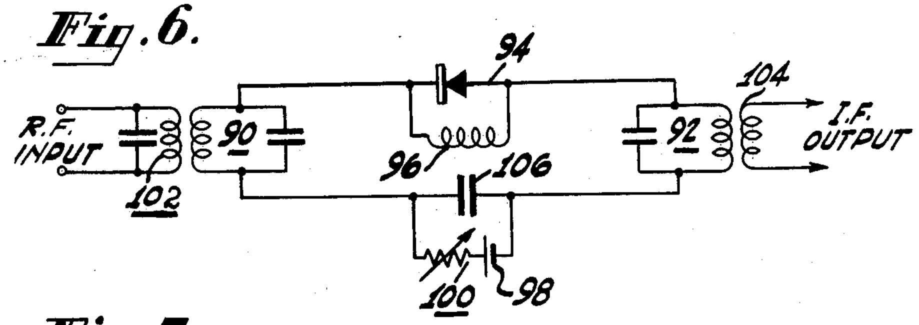
FIGURE 6 is a schematic circuit diagram illustrating still another self-oscillating frequency converter circuit embodying the invention.

Another self-oscillating frequency converter in accordance with the invention is shown in FIGURE 6. An input circuit 90 tuned to the frequency of signal modulated radio frequency carrier waves, and an output circuit 92 tuned to the IF are connected in series with a negative resistance diode 94. An inductor 96 is connected in parallel with the diode 94 and resonates with the diode capacitance at the desired oscillator frequency. The constants of the RF and IF circuits are selected so that they sufficiently load the diode 94 so that the converter circuit is stable at the tuned frequencies of these circuits. The tuned circuit including the inductor 96 is designed to have a higher Q than the effective Q of the diode which may be expressed by the formula $$Q=\frac{1}{\omega RC}$$

wherein $\omega$ is $2\pi$ times the frequency, R is the negative resistance of the diode and C is the capacity across the diode. Under these circumstances, the positive loading of the tuned circuit does not balance out the negative resistance of the diode, and the circuit will oscillate at the resonant frequency of the circuit.

The diode 94 is biased by a suitable D.C. biasing circuit including a battery 98 and a variable resistor 100 to exhibit a nonlinear negative resistance. The biasing voltage is applied to the diode from opposite terminals of a D.C. blocking capacitor 106. Signal modulated RF carrier waves which are coupled to the input circuit 90 from a parallel resonant circuit 102 interact with the locally generated oscillations in the nonlinear negative resistance of the diode 94 to produce resultant sideband or IF signals. Signals at the desired IF are developed across the IF output circuit 92 and are coupled to a utilization circuit including the winding 104.

Each of the self-oscillating diode frequency converters has the advantage of not requiring a separate oscillation generator, thereby providing the advantage of a single circuit requiring fewer component parts. In addition, the diode provides not only a nonlinear resistance which results in the production of the desired sidebands, but also exhibits a negative resistance which enables an enhanced conversion gain. If desired, self-oscillating frequency converters embodying the invention may be made tunable to vary the RF and oscillator circuit tuned frequencies in unison. For example, this simultaneous variation may be accomplished in a turret tuner by switching the inductance portions of these circuits. Furthermore, since the diode characteristic is nonlinear, the oscillator output is rich in harmonics. Hence, the fundamental frequency of oscillation may be set at a subharmonic of the desired oscillator beat signal frequency. Since the harmonic amplitude is lower by as much as an order of magnitude, the problems attendant with oscillator radiation reduction are materially reduced.

Figures 7, 9:
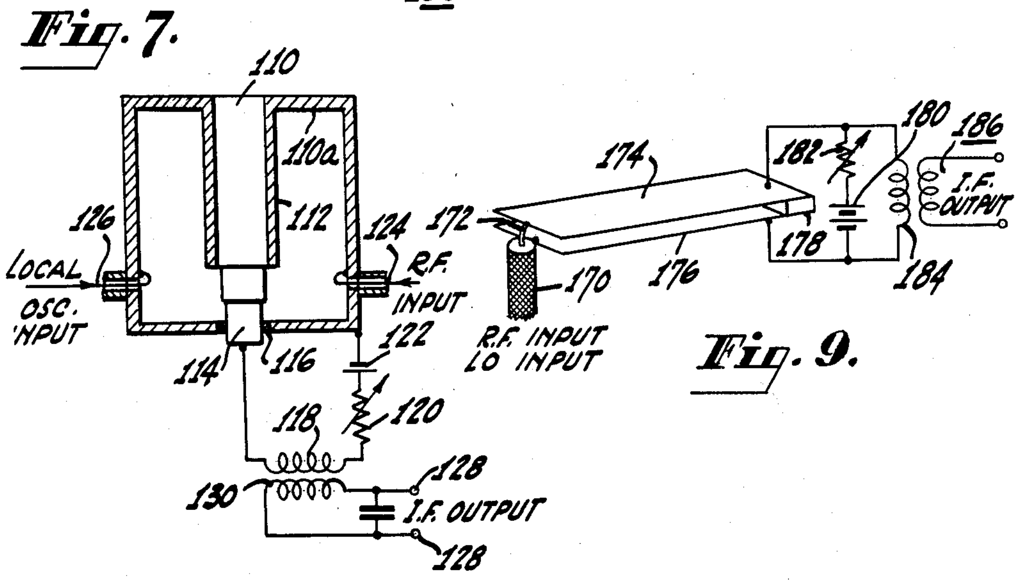
FIGURE 7 is a diagrammatic and schematic circuit diagram of a high-frequency cavity resonator type frequency converter embodying the invention.
FIGURE 9 is a diagrammatic and schematic circuit diagram of a resonant transmisison line type frequency converter in accordance with the invention.

Another embodiment of the frequency converter of the invention suitable for use in frequency ranges up to about 5000 mc. is illustrated in FIGURE 7. A cylindrical cavity resonator 110 of conductive material is constructed to resonate at a desired high frequency of operation in a kilomegacycle range. The dimensions of the resonator 110 may be in the order of centimeters. A coaxial member 112 made of conductive material is conductively connected at one of its ends to one resonator wall 110*a* in a suitable manner. The member projects internally of the cavity resonator 110. A p-n junction, negative-conductance diode 114 which may be similar to the diode described in connection with FIGURE 1, is connected at one side of the diode junction to the member 112.

The diode 114 extends through an opening on the axis of the resonator 110 so as to provide a gap 116, the capacity across which corresponds in operation to the parasitic oscillation suppression capacitor 40 of FIGURE 3. The gap may be filled with a suitable dielectric material, such as Teflon. The other side of the diode junction is coupled to a point of reference potential over a path including an RF choke 118, resistance 120 and a battery or other source of unidirectional potential 122. The resonator 110 is also coupled to a point of reference potential by a suitable means.

Signal modulated radio frequency carrier waves are applied to the resonator 110 by a coaxial cable 124. The cable 124 includes an inner conductor which extends into the cavity and is terminated by a loop which is conductively connected with the inner wall of the resonator 110 so as to couple the input circuit to the field within the cavity. A local oscillator signal is also applied to the resonator 110 by means of a coaxial cable 126 which includes a central conductor that is terminated in a loop conductively connected to the inner wall of the resonator cavity 110. The cavity is designed to have a bandpass sufficiently wide to include both the RF signal and oscillator waves. By way of example, the oscillator frequency may be 2030 mc. and the signal frequency 2000 mc.

The nonlinear interaction of the signal modulated radio frequency carrier wave and local oscillator signal in the diode 114 produces sideband signals which flow in a circuit including the inductor 118 battery 122 variable resistor 120 and the conductor formed by the cavity 110. The inductor 118 is tuned by distributed and inherent capacities including the capacity of the diode 114 to the IF which may, if desired, be the difference frequency between the radio frequency and oscillator signal waves, or 30 mc. The output signal may be derived from a pair of terminals 128 connected to a coil 130 which is coupled to the inductor 118.

Figure 8:
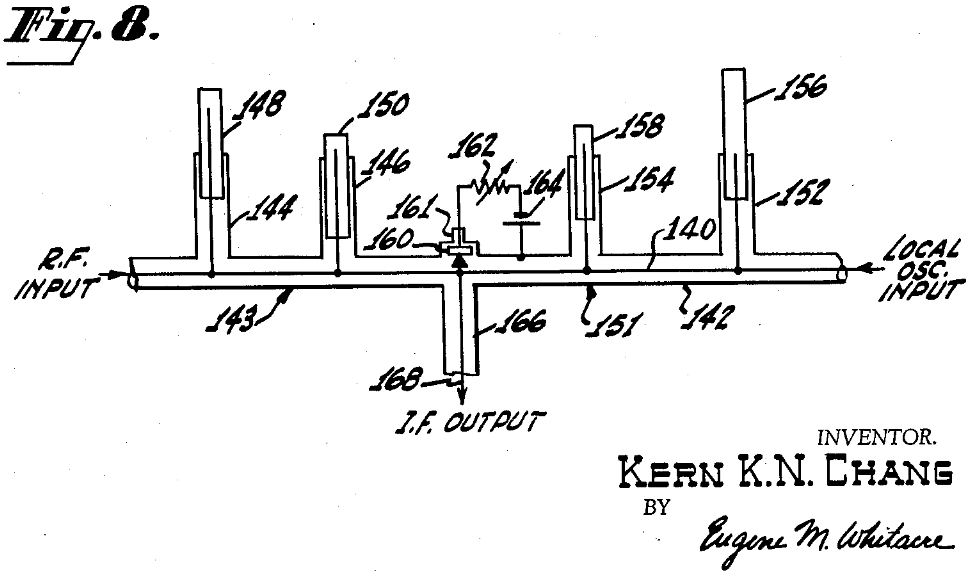
FIGURE 8 is a diagrammatic schematic circuit diagram of a high-frequency coaxial transmission line type frequency converter constructed in accordance with the invention.

Another embodiment of the invention is shown in FIGURE 8. The circuit in FIGURE 8 includes a coaxial line including a conductive inner and outer conductors 140 and 142 respectively. One end of the coaxial line 143 is connected to an RF signal source, not shown. That side of the line includes a first pair of tuner stub sections or stubs 144 and 146 respectively which include adjustable sliders 148 and 150 respectively for adjusting the electrical length thereof. The first pair of tuning stubs are spaced one-quarter wave length apart at the radio frequency, and the sliders 148 and 150 are adjusted so that the line is tuned to resonance at the frequency of the signal modulated RF wave. The other end of the line 151 is connected with a local oscillation generator, not shown. This end of the line includes a second pair of tuning stubs 152 and 154 respectively which are tuned by a pair of adjustable sliders 156 and 158. The second pair of stubs 156 and 158 are spaced apart a quarter wave length at the oscillator frequency and are adjusted to tune this end of the line to the oscillator frequency. The arrangement shown and described also provides the optimum impedance match between the RF and oscillator signal sources and a nonlinear negative resistance diode 160 which is connected between the center conductor 140 and the outer conductor 142 by way of a variable resistor 162 and a battery 164.

The diode 160 is stably forward biased to exhibit a nonlinear negative resistance by adjustment of the resistor 162. Oscillator and RF signals applied to the conductor 140 at opposite ends 151 and 143 of the coaxial line are developed across the diode 160 and bypassed to the outer conductor 142 through a feedthrough capacitor 161. The interaction of the oscillator and RF signals in the nonlinear resistance of the diode produces many resultant sidebands as hereinbefore discussed. A coaxial line section 166 includes an inner conductor 168 which is connected to the inner conductor 140 at a point near the connection of the diode 160. The line section 166 is tuned by suitable lumped circuit constants, not shown, to the IF signal whereby the IF signal output is taken through the coaxial line section 166.

Another frequency converter circuit embodying the invention is shown in FIGURE 9. Signal modulated RF waves and oscillator waves from sources not shown are coupled to a coaxial transmission line 170 which includes an inner conductor 172. The coaxial transmission line 170 is connected to drive a quarter wave resonant transmission line comprising a pair of strip conductors 174 and 176. By way of example, the quarter wave transmission line may be resonant at 1015 mc. with the RF input at 1000 mc. and the oscillator input at 1030 mc. A standing wave voltage maximum exists near the end of the quarter wave line to which the coaxial line 170 is connected. At the opposite end of the quarter wave line a nonlinear negative resistance diode 178 is mounted. The diode body may be directly connected between the conductors of the transmission line so that the anode engages the upper conductor 174. A combined signal and D.C. biasing circuit is connected between the conductors 174 and 176 of the quarter wave line so that an IF wave may be derived from the nonlinear interaction of the RF carrier and local oscillator signals. The diode is forward biased by a battery 180 which is connected in series with a variable resistor 182 to limit the voltage applied to the diode to a value which causes the diode to exhibit a stable nonlinear negative resistance characteristic. To derive the IF wave, an inductor 184 which is connected in parallel with the diode resonates with the capacitance of the diode at the IF. A parallel resonant circuit 186 is coupled to the inductor 184 to derive IF signal energy.

Although each of the frequency converter circuits described in connection with FIGURES 7 to 9 include distributed resonant circuit elements such as resonant cavities and transmission line structures, the operation thereof is essentially the same as that of frequency converter circuits employing lumped tuning elements shown in FIGURES 3–6. In each case, the diode is biased to exhibit a stable nonlinear negative resistance. The interaction of RF signal and oscillator waves in the nonlinear resistance of the diode results in the production of correspondingly signal modulated IF waves. Conversion gain exceeding that provided by known types of comparable circuits is available due to the power supplied to the IF circuit from the negative resistance diode.

What is claimed is:

1. An electrical circuit comprising in combination, a negative resistance diode, means for loading said diode to prevent self-oscillations, means providing a first source of wave signal at a first frequency coupled to said diode, means providing a second source of wave signal at a second frequency coupled to said diode, and means coupled to said diode for deriving a third signal having a frequency different from said first and second frequencies.

2. A frequency converter as defined in claim 1, wherein said means providing a second source of wave signal includes said negative resistance diode.

3. A frequency converter comprising in combination, a nonlinear negative resistance diode, a first resonant circuit coupled to said diode, said first resonant circuit tuned to the frequency of a signal modulated radio frequency carrier wave to be converted to a different frequency wave having corresponding signal modulation, means providing a source of oscillatory energy coupled to said diode, means for biasing said diode to exhibit a negative conductance over at least a portion of the operating cycle of said oscillatory energy, and a second resonant circuit tuned to said different frequency coupled to said diode said first and second resonant circuits each having a positive conductance greater than the absolute value of the maximum negative conductance of said diode to load said diode to prevent oscillations.

4. A frequency converter circuit comprising the combination of a nonlinear negative resistance diode, circuit means for applying first and second signals of different frequencies to said diode, means for biasing said diode to exhibit a negative conductance over at least a portion of the operating cycle of one of said first and second signals, and output circuit means coupled to said diode for deriving a third signal resulting from the nonlinear interaction of said first and second signals in said diode, said circuit means and said output circuit means exhibiting a positive conductance greater than the negative conductance of said diode to load said diode to prevent oscillations.

5. A frequency converter circuit comprising the combination of a nonlinear negative resistance diode, circuit means for applying first and second signals of different frequencies to said diode, output circuit means coupled to said diode for deriving a third signal resulting from the nonlinear interaction of said first and second signals in said diode, means for biasing said diode to exhibit a nonlinear negative resistance to said signals and means including said circuit means and said output circuit means for loading said diode to prevent oscillations.

6. A frequency converter comprising in combination a nonlinear negative resistance diode, a first resonant circuit tuned to the frequency of a signal modulated radio frequency carrier wave to be converted to a different frequency wave having corresponding signal modulation, means providing a source of oscillatory energy coupled to said diode, a second resonant circuit tuned to the frequency of said oscillatory energy coupled to said diode, a third resonant circuit tuned to said different frequency coupled to said diode, and means for biasing said diode to exhibit a nonlinear resistance and to operate in the negative resistance region of its operating characteristic for at least a portion of the cycle of said different frequency signal.

7. A self-oscillating frequency converter comprising, a negative resistance diode, means for applying a signal modulated radio frequency carrier wave to said diode, means providing an oscillatory circuit for producing an oscillatory wave including said diode and an inductor tuned to a frequency different from that of said radio frequency, and an output circuit resonant at a beat frequency of said radio frequency and oscillatory waves coupled to said diode.

8. A self-oscillating frequency converter comprising in combination, a negative resistance diode, means for biasing said diode to exhibit a nonlinear negative resistance characteristic, means for applying signal modulated radio frequency carrier waves to said diode, means providing an oscillatory circuit including said diode and an inductor tuned to a frequency different from that of said radio frequency and having a positive conductance less than the negative conductance of said diode, said diode operating as the active element of said oscillatory circuit to produce an oscillatory wave that interacts with said radio frequency carrier wave in the nonlinear negative resistance of said diode, and an output circuit coupled to said diode, said output circuit being resonant at a frequency of one of the signals resulting from the interaction of said radio frequency and oscillatory waves.

9. A mixer circuit comprising in combination: a nonlinear negative resistance diode; means providing a direct current biasing source for biasing said diode to exhibit a predetermined value of negative conductance; first, second and third parallel resonant circuits connected in parallel with said diode, said first resonant circuit being tuned to the frequency of a signal modulated radio frequency carrier wave to be converted to a different frequency signal having corresponding signal modulation, said second resonant circuit being tuned to the frequency of an oscillatory wave for heterodyning with said radio frequency carrier wave, said third resonant circuit being tuned to a beat frequency of said radio frequency and oscillatory waves; said first, second and third parallel resonant circuits each exhibiting a positive conductance greater than the absolute value of negative conductance of said diode to load said diode to prevent oscillations, input circuit means for applying signal modulated radio frequency carrier waves to said first resonant circuit, a local oscillation generator providing an oscillatory wave coupled to said second resonant circuit whereby said oscillatory and radio frequency waves interact in the nonlinear resistance of said diode to produce beat frequency signals, and utilization means coupled with said third resonant circuit.

10. A self-oscillating mixer circuit comprising the combination of: a negative resistance diode; first, second and third parallel resonant circuits each connected in parallel with said diode, said first parallel resonant circuit being resonant at the frequency of signal modulated radio frequency carrier waves to be converted to a different frequency signal having corresponding signal modulation, said second parallel resonant circuit being tuned to the frequency of an oscillatory wave for heterodyning with said radio frequency carrier wave, and said third parallel resonant circuit being tuned to a beat frequency signal of said oscillatory and radio frequency carrier waves; the positive conductance of said first and third parallel resonant circuits being greater than the negative conductance of said diode whereby said mixer circuit is stable at these frequencies, and the conductance of said second parallel resonant circuit being less than the negative conductance of said diode whereby oscillations are produced at the frequency at which said second circuit resonates; input circuit means for applying signal modulated radio frequency carrier waves to said first parallel resonant circuit; utilization means coupled with said third resonant circuit; and a direct current biasing means connected to bias said diode to exhibit a nonlinear negative resistance characteristic.

11. A frequency converter comprising the combination of a negative resistance diode, a biasing source connected to apply a voltage to said diode of a magnitude to cause said diode to exhibit a nonlinear negative resistance, means providing a pair of input terminals to which a signal modulated radio frequency carrier wave is applied, and a pair of output terminals, from which a corresponding modulated signal of different frequency may be derived, a first series resonant circuit tuned to the frequency of said radio frequency carrier wave coupled between one of said input terminals and said diode, a second series resonant circuit tund to said different frequency coupled between one of said output terminals and said diode, means including an inductor connected in parallel with said diode providing a circuit resonant at the frequency of an oscillatory signal, said last named circuit having a positive conductance less than the negative conductance of said diode so as to produce oscillation which interacts with said radio frequency carrier waves to produce said different frequency signal.

12. A frequency converter circuit comprising the combination of a negative resistance diode, a biasing source connected to apply a voltage to said diode of a magnitude to cause said diode to exhibit a nonlinear negative resistance, first and second parallel resonant circuits connected in series with said diode, said first resonant circuit being tuned to the frequency of a signal modulated radio frequency carrier wave to be converted to a correspondingly modulated wave of different frequency, said second resonant circuit being tuned to said different frequency, circuit means including an inductor connected in parallel with said diode providing a circuit resonant at the frequency of a heterodyning signal, the positive conductance of said last named circuit means being proportioned relative to the conductance of said diode to produce oscillation which interacts with said radio frequency carrier wave to generate said different frequency wave.

13. A frequency converter for heterodyning a signal modulated radio frequency wave with an oscillatory wave to produce a different frequency wave comprising means providing a resonant cavity responsive to the frequencies of said radio frequency and oscillatory waves, input circuit means for applying said radio frequency and oscillator waves to said resonant cavity, a negative resistance diode connected with said cavity, means for biasing said diode to exhibit a nonlinear negative resistance, and circuit means coupled to said diode responsive to said different frequency wave.

14. A frequency converter for heterodyning a signal modulated radio frequency wave with an oscillatory wave to produce a different frequency wave comprising a coaxial transmission line having an inner conductor and an outer conductor, a negative resistance diode connected between said inner and outer conductors at an intermediate point along said coaxial line, means for applying signal modulated radio frequency waves to one end of said line, means for tuning said one end of said coaxial line to the frequency of said radio frequency waves, means for applying oscillatory waves to the other end of said coaxial line, means for tuning said other end of said line to the frequency of said oscillator waves, means for biasing said diode to exhibit a nonlinear negative resistance to the waves applied thereto from the ends of said coaxial transmission line, and an output circuit responsive to said different frequency coupled to said diode.

15. A frequency converter for heterodyning a signal modulated radio frequency carrier wave with an oscillatory wave to produce a different frequency wave comprising a resonant transmission line having a pair of generally parallel conductors, said resonant transmission line having a bandpass characteristic wide enough to be responsive to both said radio frequency and oscillatory waves, means for applying said radio frequency and oscillatory waves to said transmission, a negative resistance diode connected between the conductors of said transmission line, means for biasing said diode to exhibit a nonlinear negative resistance, and output circuit means responsive to said different frequency coupled to said diode.

16. A frequency converter for combining a signal modulated radio frequency carrier wave with a heterodyning wave to produce a wave of different frequency having corresponding signal modulation comprising: a negative resistance diode; first, second and third resonant circuits respectively resonant at said radio frequency, said heterodyne wave frequency and said different frequency, means for applying radio frequency carrier wave to said diode in series through said first resonant circuit, one of said second and third resonant circuits being connected in series with said diode, means biasing said diode to exhibit a nonlinear negative resistance, and utilization means coupled to said third circuit.

17. A frequency converter comprising a negative resistance diode and circuit means including said diode for combining a signal modulated carrier wave with an oscillatory wave to produce a signal modulated intermediate frequency wave, the relationship of the negative conductance of said diode and the positive conductance of said circuit means being such as to provide a conversion gain sufficient to overcome at least a portion of the losses otherwise introduced by said frequency converter.

18. A frequency converter as defined in claim 17 wherein said negative resistance diode is a tunnel diode biased for operation near a point where its current voltage characteristic changes from a positive to a negative resistance.

19. A frequency converter comprising a negative resistance diode that may be stably biased without oscillation in its negative resistance region and means including said diode for combining a signal modulated carrier wave with an oscillatory wave to produce a signal modulated intermediate frequency wave.

20. A frequency converter comprising in combination a non-linear negative resistance diode, a first resonant circuit coupled to said diode, said first resonant circuit tuned to receive a signal modulated radio frequency carrier wave, means providing a source of oscillatory waves of a given frequency coupled to said diode, and a second resonant circuit coupled to said diode, said second resonant circuit tuned to a difference frequency between said radio frequency carrier wave and said oscillatory wave, said difference frequency being created by the interaction of said carrier and oscillatory waves in the non-linear resistance of said diode.

21. A frequency converter having a conversion gain of greater than unity for a superheterodyne system comprising a negative resistance diode, means providing a direct current biasing source for biasing said diode to exhibit a non-linear negative resistance, a first resonant circuit coupled to said diode, said first resonant circuit tuned to the frequency of a signal modulated radio frequency carrier wave to be converted to an intermediate frequency having corresponding signal modulation, a second resonant circuit coupled to said diode, said second resonant circuit being tuned to the frequency of an oscillatory wave for heterodyning with said radio frequency wave, a local oscillation generator providing an oscillatory wave coupled to said second resonant circuit, and a third resonant circuit coupled to said diode, said third resonant circuit being tuned to a beat frequency signal of said oscillatory and radio frequency carrier waves, said first, second and third resonant circuits all having a positive conductance greater than the absolute value of the negative conductance of said diode whereby stable operation at the three resonant frequencies of said resonant circuits and a conversion gain of greater than unity is provided.

22. A frequency converter circuit comprising a negative resistance diode biased to exhibit a predetermined value of negative conductance, means providing a signal input circuit resonant at a first frequency coupled to said diode, said first circuit exhibiting a positive conductance at said first frequency that is greater than the absolute value of negative conductance of said diode to load said diode to prevent oscillation at said first frequency, and means providing a second circuit for causing oscillatory waves of a second frequency to be applied to said diode, the relationship between the negative conductance of said diode and the positive conductance of the circuits coupled to said diode being such as to provide a conversion gain sufficient to overcome at least a portion of the losses that are otherwise introduced by said converter circuit.

23. An electrical circuit comprising in combination a negative resistance diode having a current-voltage characteristic including positive resistance regions separated by a negative resistance region, first circuit means for applying to said diode oscillatory waves of a first frequency, second circuit means for applying to said diode electrical waves of a second frequency, means for stably biasing said diode in a nonlinear resistance region between one of said positive resistance regions and said negative resistance region, means including said first and second circuit means for loading said diode to prevent oscillations, and output circuit means for deriving a signal produced by the interaction of said oscillatory waves and electrical waves in said nonlinear region of said diode.

24. A frequency converter comprising in combination a tunnel diode having an operating region which exhibits a negative conductance, and first, second and third circuits each tuned respectively to first, second and third frequencies coupled to said diode, at least two of said tuned circuits exhibiting positive conductances greater than the absolute value of negative conductance of said diode.

25. A frequency converter comprising in combination a negative resistance diode exhibiting a negative conductance over a portion of its operating characteristic, and first, second and third circuits each tuned respectively to first, second and third frequencies coupled to said diode, said third frequency equal to the difference between said first and second frequencies, and at least said first and third circuits exhibiting positive conductances greater than the absolute value of negative conductance exhibited by said diode.

26. A frequency converter comprising in combination a negative resistance diode biased to exhibit a predetermined absolute value of negative conductance, means providing a first circuit coupled to said diode and tuned to resonate at the frequency of a received signal modulated radio frequency carrier wave, means providing an oscillatory circuit including an inductor coupled to resonate with the inherent capacitance of said diode at a predetermined frequency, said oscillatory circuit exhibiting a positive conductance at said predetermined frequency that is less than the absolute value of negative conductance of said diode so that said diode will oscillate at said predetermined frequency, and means providing an output circuit tuned to resonate at the difference frequency between said radio frequency carrier wave and said predetermined oscillatory frequency, said difference frequency produced by the interaction of said carrier and oscillatory waves in the nonlinear resistance of said diode, said output circuit exhibiting a positive conductance that is related to the predetermined negative conductance of said diode so as to provide a conversion gain sufficient to overcome a portion of the losses introduced by said diode while operated as a nonlinear mixer.

27. A frequency converter according to claim 26 wherein the positive conductance exhibited by said output circuit is so related to the predetermined negative conductance of said diode as to provide a conversion gain of greater than unity.

28. A radio-frequency amplifier and converter comprising: a narrow junction degenerate semiconductor diode exhibiting a negative resistance region at the low forward voltage range of its current-voltage characteristic; bias means in circuit with said diode establishing a direct current load line which intersects said characteristic only in said negative resistance region; and a frequency responsive network in circuit with said diode, said network including a local oscillator resonant circuit branch, at least one intermediate frequency resonant circuit branch and at least one input resonant circuit branch, the parallel resonant impedance of said local oscillator circuit branch exceeding the highest impedance of either of the other circuit branches producing oscillations only at the parallel resonant frequency of said local oscillator circuit branch and amplification at each of the other frequencies.

29. A radio-frequency amplifier and converter comprising: a narrow junction degenerate semiconductor diode exhibiting a negative resistance region in the low forward voltage range of its current-voltage characteristic; bias means in circuit with said diode establishing a direct current load line therefor which intersects said characteristic only in said negative resistance region; and a frequency responsive network in circuit with said diode and including an input resonant circuit branch resonant to a selected signal frequency, an output resonant circuit branch resonant to a selected intermediate frequency and a local oscillator circuit branch resonant to a frequency such that when mixed with said signal frequency the selected intermediate frequency is produced.

30. A radio-frequency amplifier and converter comprising: a narrow junction degenerate semiconductor diode; a frequency responsive network in circuit with said diode, said network including at least one input circuit branch, at least one output circuit branch and a local oscillator circuit branch, each of said branches having its highest impedance at a different frequency, the highest impedance of each of the branches being less than the highest impedance of said local oscillator branch such that oscillations are produced only at the frequency corresponding to the highest impedance of said local oscillator circuit branch; and bias means in circuit with said diode establishing a direct current load line which intersects the diode current-voltage characteristic only in the negative resistance region.

31. A radio-frequency amplifier and converter comprising: a narrow junction degenerate semiconductor diode exhibiting a negative resistance region in the low forward voltage range of its current-voltage characteristic; bias means in circuit with said diode establishing a direct-current load line which intersects said characteristic only in said negative resistance region; and a frequency responsive network in circuit with said diode and including an input resonant circuit branch, an output resonant circuit branch and a local oscillator resonant circuit branch, the impedances of said branches being so selected that the highest impedance of said local oscillator circuit branch exceeds the highest impedance of either of the other two circuit branches.

32. A circuit comprising: a narrow junction degenerate semiconductor diode exhibiting a negative resistance region at the low forward voltage range of its current-voltage characteristic; bias means in circuit with said diode establishing a direct current load line which intersects said characteristic only in said negative resistance region; an input resonant circuit branch in series with said diode and resonant to a selected signal frequency; an output resonant circuit branch in series with said diode resonant to a predetermined intermediate frequency; and a local oscillator resonant circuit branch resonant to a frequency such that when mixed with the signal frequency the predetermined intermediate frequency is produced, said local oscillator having a parallel resonant impedance exceeding the highest impedance of either of the other two branches.

References Cited in the file of this patent

UNITED STATES PATENTS

| | | |
|---|---|---|
| 2,469,569 | Ohl | May 10, 1949 |
| 2,760,061 | Pan et al. | Aug. 21, 1956 |
| 2,896,075 | Addleman | July 21, 1959 |

FOREIGN PATENTS

Esaki: Physical Review, vol. 109, page 603, November 1958.

The Crystal as a Generator and Amplifier by Gabel, The Wireless World and Radio Review, Part 1, Oct. 1, 1924, pages 2 to 5 and Part 2, October 8, 1924, pages 47 to 50 (Part 2 relied on).